(12) United States Patent
Komirenko et al.

(10) Patent No.: US 8,533,636 B2
(45) Date of Patent: Sep. 10, 2013

(54) TOLERABLE FLARE DIFFERENCE DETERMINATION

(75) Inventors: Sergiy Komirenko, Cupertino, CA (US); Nicolas Bailey Cobb, Sunnyvale, CA (US); Raghu Chalasani, San Jose, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 13/279,176

(22) Filed: Oct. 21, 2011

(65) Prior Publication Data
US 2013/0104091 A1    Apr. 25, 2013

(51) Int. Cl.
*G06F 17/50*    (2006.01)
(52) U.S. Cl.
USPC ............................................. 716/51; 716/53

(58) Field of Classification Search
USPC .................................................. 716/51, 53
See application file for complete search history.

(56) References Cited

U.S. PATENT DOCUMENTS

| 2011/0065027 A1* | 3/2011 | Inanami et al. ................ 430/5 |
| 2012/0198395 A1* | 8/2012 | Arisawa et al. ................ 716/53 |
| 2012/0202140 A1* | 8/2012 | Uno et al. ..................... 430/5 |

\* cited by examiner

*Primary Examiner* — Suresh Memula

(57) ABSTRACT

Aspects of the invention relate to techniques for compensating flare effects in a lithographic process for an array of identical circuits to be fabricated on a wafer. According to various implementations of the invention, a reference circuit is selected from the array of identical circuits and intolerable flare difference regions are determined based on flare difference layers and tolerable flare difference layers. The lithographic process result for the array of identical circuit may be derived from that for the reference circuit and the intolerable flare difference regions.

20 Claims, 4 Drawing Sheets

Flow chart
400

TOLERABLE FLARE DIFFERENCE DETERMINATION

FIELD OF THE INVENTION

The present invention relates to the field of lithography. Various implementations of the invention may be useful for compensating flare effects.

BACKGROUND OF THE INVENTION

Extreme ultraviolet (EUV) lithography is a leading candidate for the next-generation lithographic solution. The optical irradiation wavelength for the EUV lithography is 13.5 nm. The prototypes operational in the field have demonstrated the feasibility of fabricating 32- and 22-nm node devices. A particular challenge in the EUV lithography is flare (also called stray light or scattered light) modeling and compensation. The flare is incoherent light that does not follow the normal optical path. When a light ray is incident upon a surface, it is reflected off the surface as a light ray in an ideal situation. The roughness of the surface, however, can produce additional light rays through light scattering in addition to the reflected light ray. These additional light rays are called flare. In lithography, the flare may be caused by the roughness of lens/mirror surface finish, non-ideal anti-reflection coatings, and dust (or contamination) on the optics. The unwanted flare can degrade image quality and eventually lithographic performances such as control of critical dimension (CD) of printed features and the process window. The flare problems are more serious in the EUV lithography than in the deep ultraviolet (DUV) lithography in which the shortest wavelength is 193 nm because the nature of flare is light scattering and the light scattering is proportional to $1/\lambda^2$ ($\lambda$ is the light wavelength).

Besides the $1/\lambda^2$ dependence, the flare has a long-range effect even though it can also affect the control of CD on a nanometer scale. This long-range effect dictates that layout features over a millimeter range should be considered for modeling and correcting flare effects. By contrast, traditional OPC (optical proximity correction) tools focus on layout features within a distance comparable to the light diffraction range which is only a few times of the light wavelength. It is thus not straightforward to compensate for the long-range flare effect in an OPC process.

In semiconductor device fabrication, an array of identical circuits is often fabricated on a wafer. It would be preferable to be able to apply the OPC result for one representative circuit to the other circuits in the array. One of the main concerns for such an approach is these identical circuits have different flare intensities. Fortunately, the flare intensity difference (flare difference) for many of the identical circuits may not be significant enough to warrant an additional OPC process. Even for circuits on which the flare is significantly different from that on the representative circuit, the flare difference may be significant only in some particular regions of these circuits. It is therefore desirable to search for methods that can determine those particular regions with intolerable flare difference (intolerable flare difference regions) and conduct additional OPC only on them.

BRIEF SUMMARY OF THE INVENTION

Aspects of the invention relate to techniques for compensating flare effects in a lithographic process for an array of identical circuits (or chips) to be fabricated on a wafer. One example of the lithographic process is OPC. According to various implementations of the invention, a reference circuit is selected from the array of identical circuits and intolerable flare difference regions are determined such that the lithographic process result for the array of identical circuit may be derived from that for the reference circuit and the intolerable flare difference regions.

To determine the intolerable flare difference regions, a first flare map that comprises flare intensity layers and a second flare map that comprises boundary flare intensity layers are determined first according to various embodiments of the invention. Flare difference layers and tolerable flare difference layers may then be generated based on the first flare map and the second flare map, respectively. Finally, the obtained flare difference layers and tolerable flare difference layers are analyzed to determine the tolerable flare difference regions.

DETAILED DESCRIPTION OF THE INVENTION

General Considerations

Figure 1:
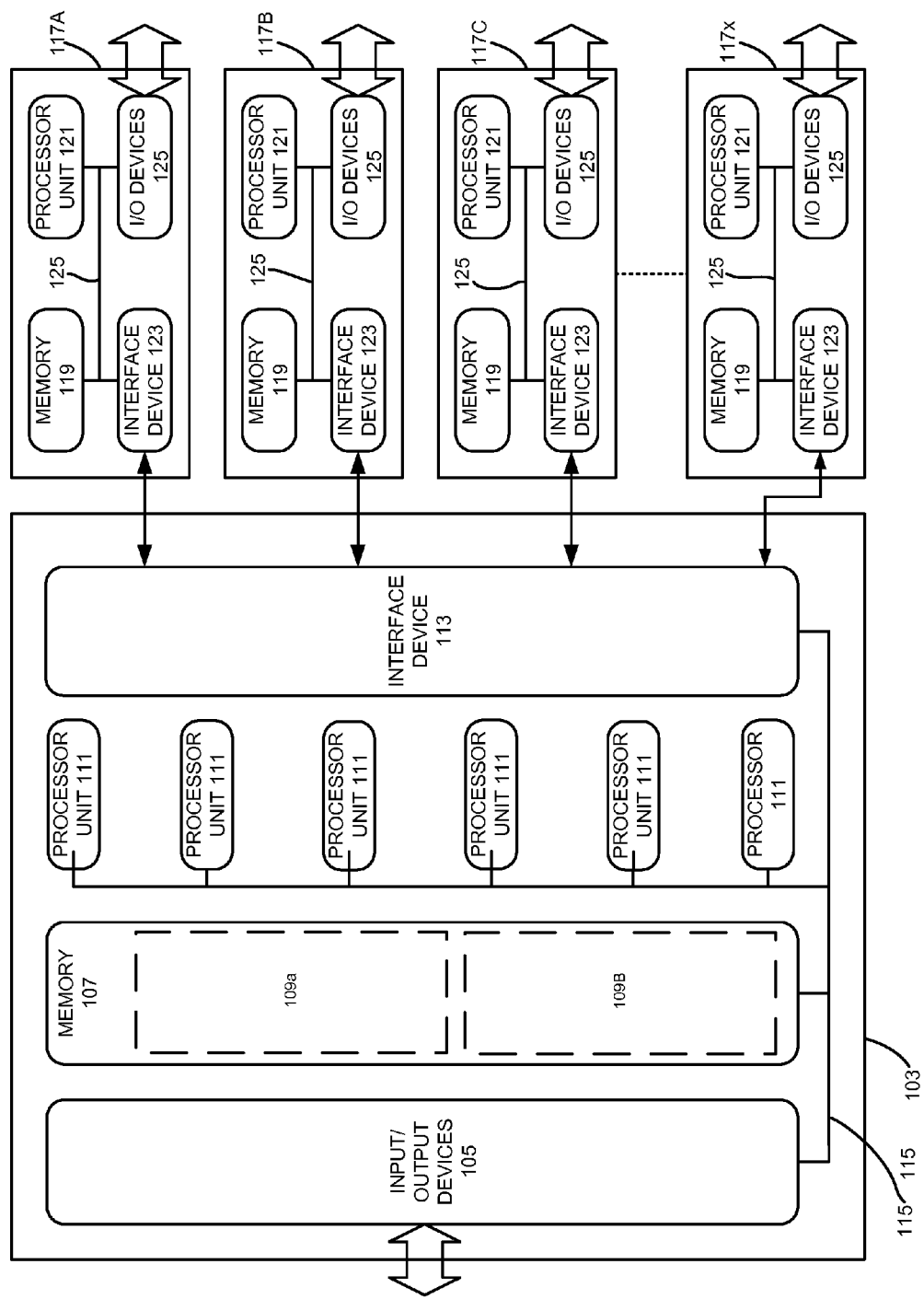
FIG. 1 illustrates an example of a computing system that may be used to implement various embodiments of the invention.

Various aspects of the present invention relate to compensating flare effects in a lithographic process for an array of identical circuits (or chips) to be fabricated on a wafer. In the following description, numerous details are set forth for the purpose of explanation. However, one of ordinary skill in the art will realize that the invention may be practiced without the use of these specific details. In other instances, well-known features have not been described in details to avoid obscuring the present invention.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "generate" and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Exemplary Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
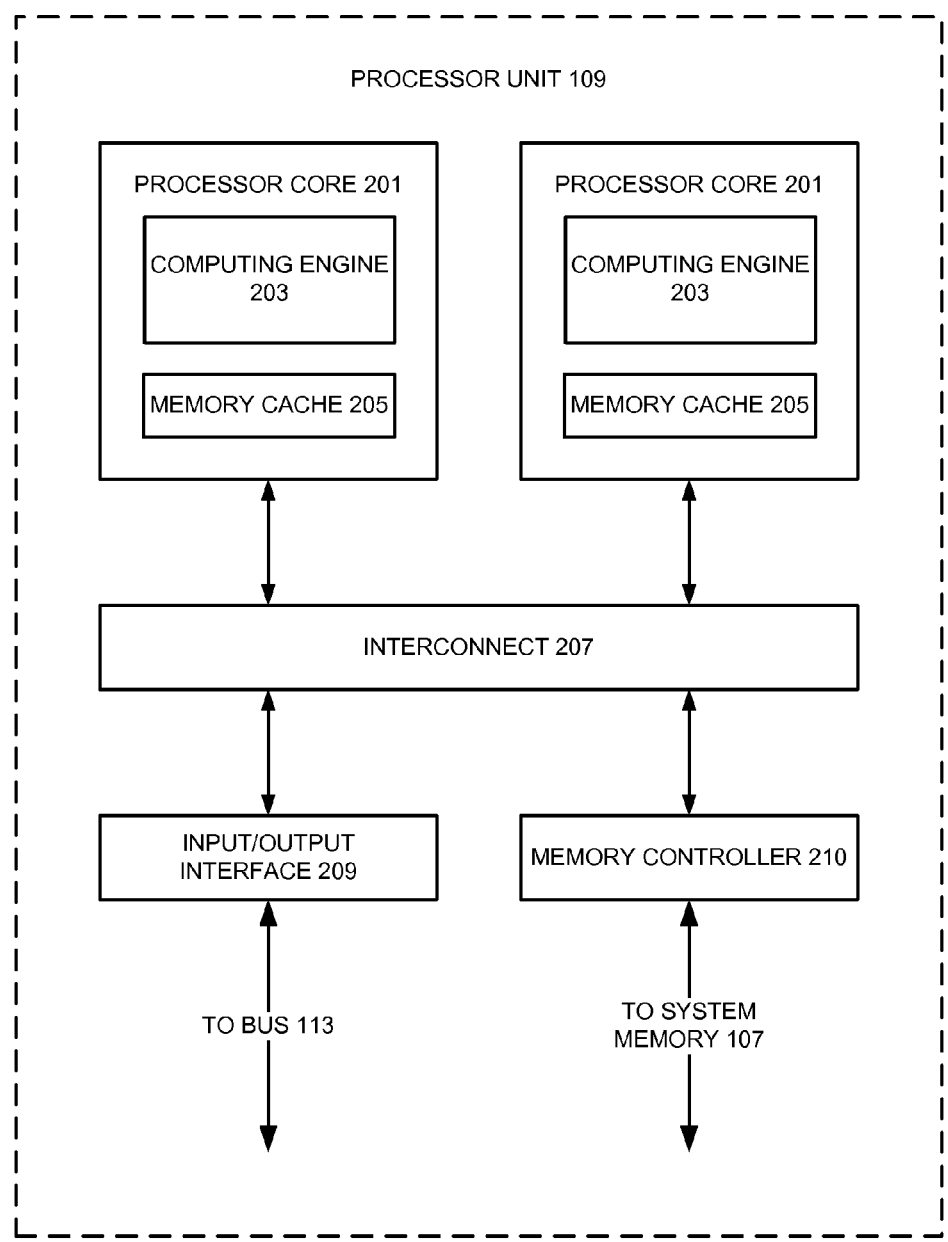
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Tolerable Flare Difference Determination Tools and Methods

Figure 3:
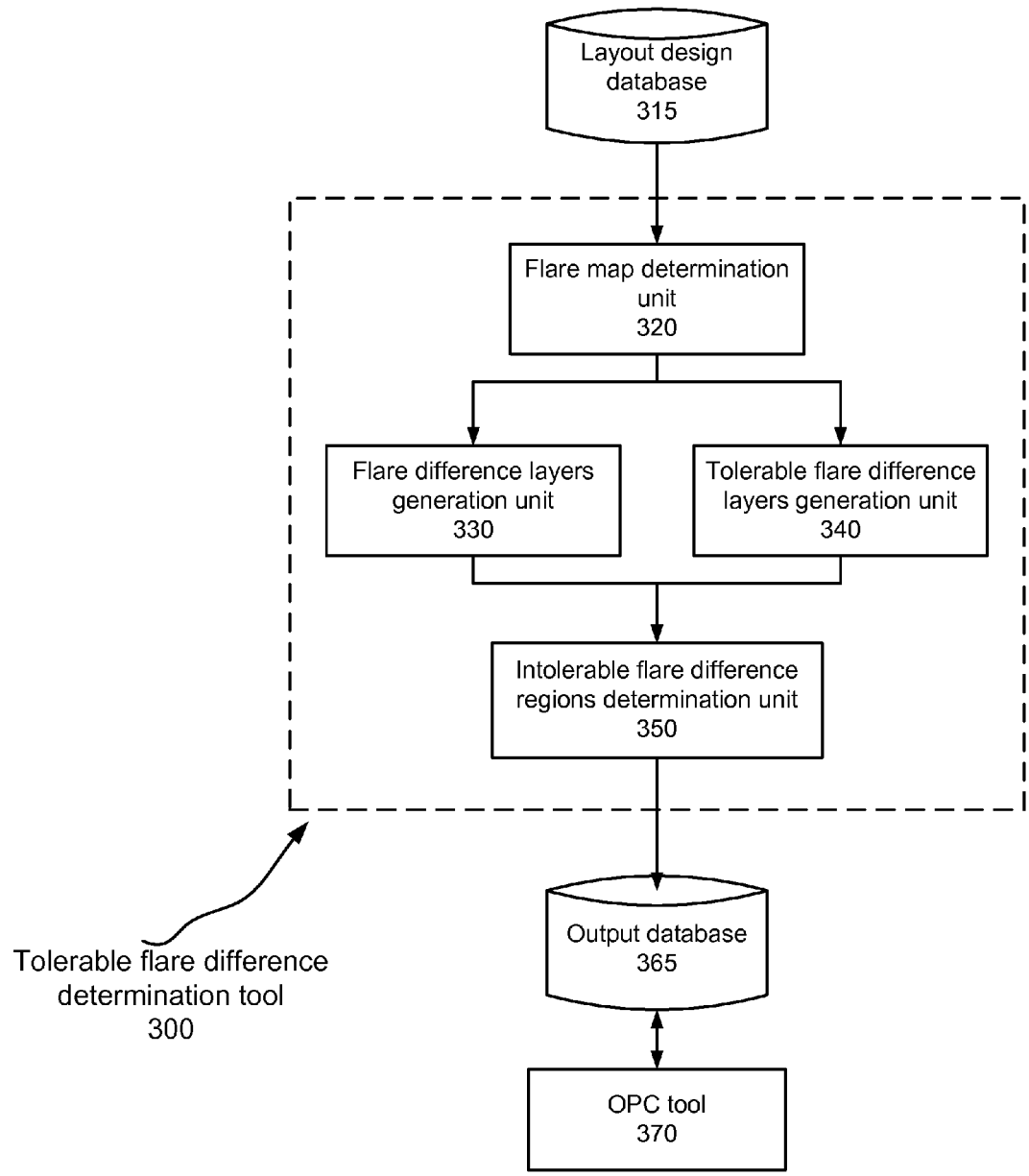
FIG. 3 illustrates a tool for tolerable flare difference determination that may be employed according to various embodiments of the invention.

FIG. 3 illustrates an example of a tool for tolerable flare difference determination tool according to various embodiments of the invention. As seen in the figure, the tolerable flare difference determination tool 300 includes five units: a flare map determination unit 320, a flare difference layers generation unit 330, a tolerable flare difference layers generation unit 340 and an intolerable flare difference regions determination unit 350. As will be discussed in more detail below, some implementations of the tolerable flare difference determination tool 300 may cooperate with (or incorporate) one or more of a layout design database 315, an output database 365, and an OPC tool 370. While the layout design database 315 and the output database 365 are shown as separate units in FIG. 3, a single data storage medium may be used to implement some or all of these databases.

According to some embodiments of the invention, one or more of the flare map determination unit 320, the flare difference layers generation unit 330, the tolerable flare difference layers generation unit 340, the intolerable flare difference regions determination unit 350 and the OPC tool 370 may be implemented by executing programming instructions on one or more programmable computers/computer systems, such as the computing system illustrated in FIG. 1 and FIG. 2. Correspondingly, some other embodiments of the invention may be implemented by software instructions, stored on a non-transitory computer-readable medium, for instructing one or more programmable computers/computer systems to perform the functions of one or more of the flare map determination unit 320, the flare difference layers generation unit 330, the tolerable flare difference layers generation unit 340, the intolerable flare difference regions determination unit 350 and the OPC tool 370. As used herein, the term "non-transitory computer-readable medium" refers to computer-readable medium that are capable of storing data for future retrieval, and not just propagating electro-magnetic waves. The non-transitory computer-readable medium may be, for example, a magnetic storage device, an optical storage device, a "punched" surface type device, or a solid state storage device.

Figure 4:
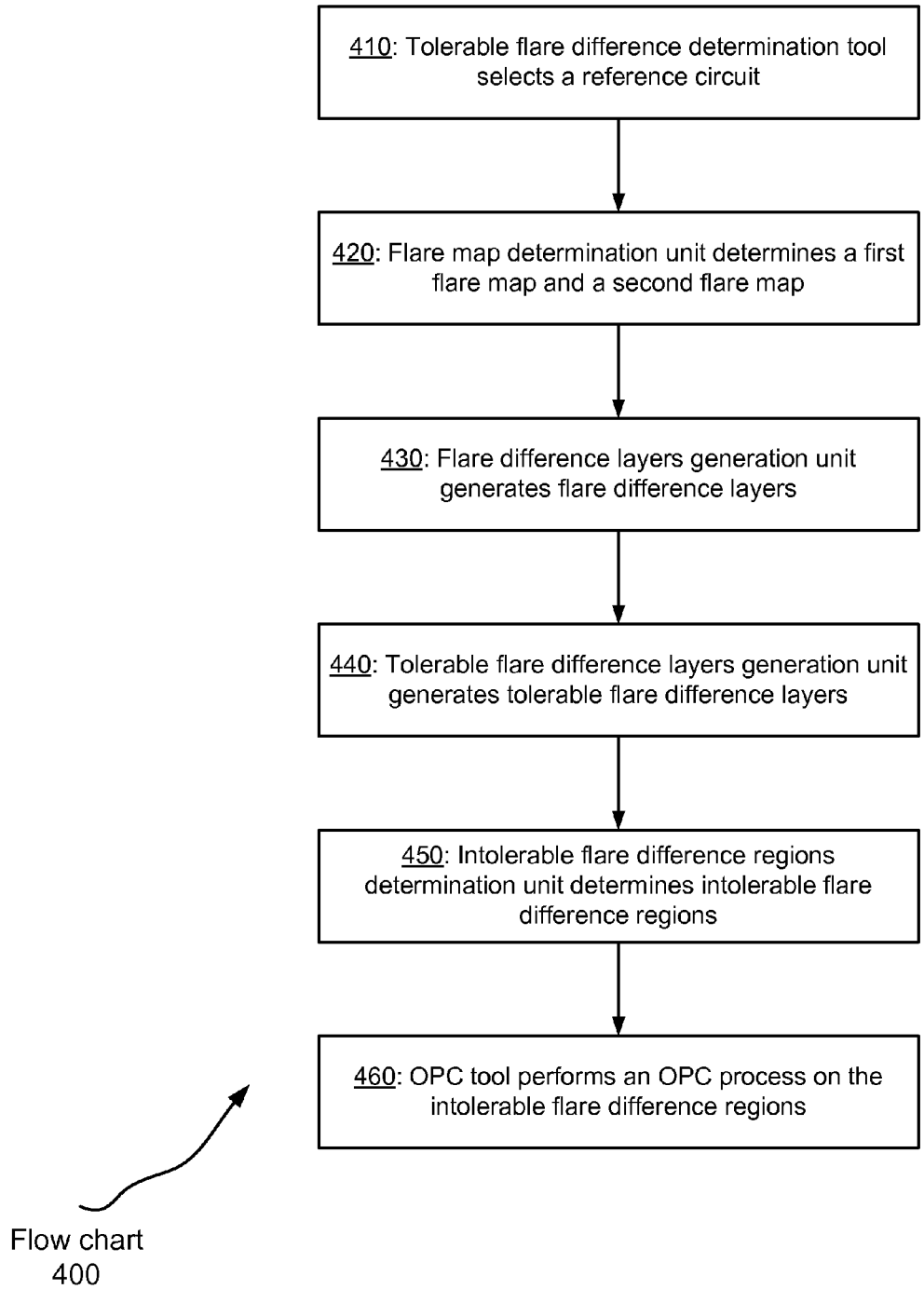
FIG. 4 illustrates a flowchart describing methods of tolerable flare difference determination that may be employed by various embodiments of the invention.

For ease of understanding, hotspot determination methods that may be employed according to various embodiments of the invention will be described with reference to the tolerable flare difference determination tool 300 illustrated in FIG. 3 and the method for tolerable flare difference determination shown in the flow chart 400 illustrated in FIG. 4. It should be appreciated, however, that alternate implementations of a tolerable flare difference determination tool may be used to perform the tolerable flare difference determination method illustrated in the flow chart 400 illustrated in FIG. 4 according to various embodiments of the invention. In addition, it should be appreciated that implementations of the tolerable flare difference determination tool 300 may be employed with other methods for tolerable flare difference determination according to different embodiments of the invention.

Initially, in operation 410, the tolerable flare difference determination tool 300 selects a reference circuit in an array of identical circuits that are to be fabricated on a wafer. Layout features for the reference circuit and intolerable flare difference regions to be determined may be processed by a lithographic technique and the result may be used to derive the processing result for the whole array of identical circuits. With various implementations of the invention, a circuit near the middle of the array is selected as the reference circuit. This may reduce the total area of intolerable flare difference regions.

Next, in operation 420, the flare map determination unit 320 determines a first flare map and a second flare map for the array of identical circuits. The first flare map comprises flare intensity layers and the second flare map comprises boundary flare intensity layers. Each of the flare intensity layers contains a range of flare intensity values with its upper limit being the lower limit for the next flare intensity layer. Each of the boundary flare intensity layers also contains a range of flare intensity values. But they are centered at the boundary between two adjacent flare intensity layers and their range, or tolerable flare difference value, is often smaller than the range for the flare intensity layers. The tolerable flare difference value may be determined by experience or experiments. The flare intensity values for determining the first and second flare maps may be derived by using any flare determination methods, such as those described in the U.S. patent application Ser. No. 13/092,072, entitled "Flare Correction In Lithography," filed on Apr. 21, 2011, and naming Raghu Chalasani and Michael Lam as inventors, which application is incorporated herein by reference.

In some embodiments of the invention, the flare intensity layers and the boundary flare intensity layers may use the form of $F_i(n\Delta)$ and the form of $F_j((n+\frac{1}{2})\Delta)$, respectively. Here, n=0, 1, ... k (k is a non-negative integer), $\Delta$ is a relative flare intensity value (e.g., $\Delta$=0.005, i.e. 0.5% of the total flare intensity value or 0.5% of the total illumination light intensity), $F_i(n\Delta)$ contain flare intensity values between $(n-\frac{1}{2})\Delta$ and $(n+\frac{1}{2})\Delta$, and $F_j((n+\frac{1}{2})\Delta)$ contain flare intensity values between $(n+\frac{1}{2})\Delta-\sigma/2$ and $(n+\frac{1}{2})\Delta+\sigma/2$. Accordingly, a boundary flare intensity layer $F_j((m+\frac{1}{2})\Delta)$ contains flare intensity values with a range of $\sigma$ and centered at $(m+\frac{1}{2})\Delta$. The flare intensity $(m+\frac{1}{2})\Delta$ is the boundary flare intensity value between two adjacent flare intensity layers $F_i(m\Delta)$ and $F_i((m+1)\Delta)$. The range $\sigma$ is the tolerable flare difference range noted above and may be set at, e.g., 0.002, which is 0.2% of the total flare intensity value or 0.2% of the total illumination light intensity.

In operation 430, the flare difference layers generation unit 330 generates flare difference layers based on the first flare map and flare intensity information for the reference circuit. The flare difference layers define flare difference regions on circuits in the array other than the reference circuit where the flare is different from corresponding regions of the reference circuit. To determine the flare difference regions, the flare difference layers generation unit 330 analyzes flare intensity information for the reference circuit and the other circuits included in the first flare map. For example, in some embodiments of the invention, the flare difference layers generation unit 330 may first generate reference flare intensity layers $F_i^R(n\Delta)$ by replacing flare intensity values for the other circuits in the array with corresponding flare intensity values for the reference circuit. Then the flare difference layers generation unit 330 performs an XOR operation: $F_i(n\Delta)$ XOR $F_i^R(n\Delta)$. The result of the XOR operation is the flare difference layers.

In operation 440, the tolerable flare difference layers generation unit 340 generates tolerable flare difference layers based on the second flare map and boundary flare intensity information for the reference circuit. The tolerable flare difference layers define tolerable flare difference regions where the flare difference is tolerable. To determine the tolerable flare difference regions, the tolerable flare difference layers generation unit 340 analyzes boundary flare intensity information for the reference circuit and the other circuits included in the second flare map. For example, in some embodiments of the invention, the tolerable flare difference layers generation unit 340 may first generate reference boundary flare intensity layers $F_j^R((n+\frac{1}{2})\Delta)$ by replacing flare intensity values for other circuits in the array with corresponding flare intensity values for the reference circuit. Then the tolerable flare difference layers generation unit 340 performs an AND operation: $F_j((n+\frac{1}{2})\Delta)$ AND $F_j^R((n+\frac{1}{2})\Delta)$. The result of the AND operation is the tolerable flare difference layers.

It should be appreciated that while the operation 440 is shown as the next operation following the operation 430 in the flow chart 400, the operations 430 and 440 may be performed simultaneously. Alternatively, the operation 440 may be performed before the operation 430.

In operation 450, the intolerable flare difference regions determination unit 350 determines intolerable flare difference regions based on the flare difference layers and the tolerable flare difference layers. As discussed above, the flare difference layers define the flare difference regions and the tolerable flare difference layers define the tolerable flare difference regions. Accordingly, the intolerable flare difference regions determination unit 350 may derive the intolerable flare difference regions by excluding the tolerable flare difference regions from the flare difference regions. In some embodiments of the invention, the flare difference layers and the tolerable flare difference layers are first combined separately to generate a combined flare difference layer and a combined tolerable flare difference layer. The intolerable flare difference regions determination unit 350 then removes regions defined by the combined tolerable flare difference layer from regions defined by the combined flare difference layer. The logical OR operation may be used for the two combination processes and the NOT operation may be used for the removing process.

The obtained intolerable flare difference regions are the regions in the array of identical circuits on which a lithographic process needs to be performed in addition to the reference circuit. The rest regions may use the process result for the reference circuit to save computational resources and time. Some embodiments of the invention include an operation 460, in which the OPC tool 370 performs an OPC process on the intolerable flare difference regions. The process result is combined with that for the reference circuit to derive the OPC result for the whole array. In addition to OPC, the obtained intolerable flare difference regions may also be used to speed up other lithographic processes such as aerial image and process window determination.

Conclusion

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of tolerable flare difference determination, comprising:
   selecting a reference circuit in an array of identical circuits that are to be fabricated on a wafer;
   determining, for the array of identical circuits, a first flare map that comprises flare intensity layers and a second flare map that comprises boundary flare intensity layers;
   generating flare difference layers based on the first flare map and flare intensity information for the reference circuit;
   generating tolerable flare difference layers based on the second flare map and boundary flare intensity information for the reference circuit;
   determining intolerable flare difference regions based on the flare difference layers and the tolerable flare difference layers; and
   storing information of the intolerable flare difference regions in a tangible medium.

2. The method recited in claim 1, further comprising:
   performing a lithographic process on layout features for the intolerable flare difference regions and the reference circuit.

3. The method recited in claim 2, wherein the lithographic process is an optical proximity correction (OPC) process.

4. The method recited in claim 1, wherein the flare intensity layers are represented by $F_i(n\Delta)$ and the boundary flare intensity layers are represented by $F_j((n+\frac{1}{2})\Delta)$, wherein n=0, 1, ... k, $\Delta$ is a relative flare intensity value, the flare intensity layers $F_i(n\Delta)$ contain flare intensity values between $(n-\frac{1}{2})\Delta$ and $(n+\frac{1}{2})\Delta$, the boundary flare intensity layers $F_j((n+\frac{1}{2})\Delta)$ contain flare intensity values between $(n+\frac{1}{2})\Delta-\sigma/2$ and $(n+\frac{1}{2})\Delta+\sigma/2$, and $\sigma$ is a predetermined flare tolerance value.

5. The method recited in claim 4, wherein the generating flare difference layers comprises:
   generating reference flare intensity layers $F_i^R(n\Delta)$ by replacing flare intensity values for other circuits in the array of identical circuits in $F_i(n\Delta)$ with corresponding flare intensity values for the reference circuit; and
   performing an operation of $F_i(n\Delta)$ XOR $F_i^R(n\Delta)$.

6. The method recited in claim 4, wherein the generating tolerable flare difference layers comprises:
   generating reference boundary flare intensity layers $F_j^R((n+\frac{1}{2})\Delta)$ by replacing flare intensity values for the array of identical circuits in $F_j((n+\frac{1}{2})\Delta)$ with corresponding flare intensity values for the reference circuit; and
   performing an operation of $F_j((n+\frac{1}{2})\Delta)$ AND $F_j^R((n+\frac{1}{2})\Delta)$.

7. The method recited in claim 1, wherein the determining intolerable flare difference regions comprises:
   generating a combined flare difference layer by combining the flare difference layers;
   generating a combined tolerable flare difference layer by combining the tolerable flare difference layers; and
   removing regions defined by the combined tolerable flare difference layer from regions defined by the combined flare difference layer.

8. The method recited in claim 7, wherein the combining the flare difference layers comprises performing an OR operation on the flare difference layers, the combining the tolerable flare difference layers comprises performing an OR operation on the tolerable flare difference layers, and the removing comprises performing a operation of the combined flare difference layer NOT the combined tolerable flare difference layer.

9. A non-transitory processor-readable medium storing processor-executable instructions for causing one or more processors to perform a method of tolerable flare difference determination, the method comprising:
   selecting a reference circuit in an array of identical circuits that are to be fabricated on a wafer;
   determining, for the array of identical circuits, a first flare map that comprises flare intensity layers and a second flare map that comprises boundary flare intensity layers;
   generating flare difference layers based on the first flare map and flare intensity information for the reference circuit;
   generating tolerable flare difference layers based on the second flare map and boundary flare intensity information for the reference circuit;
   determining intolerable flare difference regions based on the flare difference layers and the tolerable flare difference layers; and
   storing information of the intolerable flare difference regions in a tangible medium.

10. The non-transitory processor-readable medium recited in claim 9, wherein the method further comprises performing a lithographic process on layout features for the intolerable flare difference regions and the reference circuit.

11. The non-transitory processor-readable medium recited in claim 9, wherein the flare intensity layers are represented by $F_i(n\Delta)$ and the boundary flare intensity layers are represented by $F_j((n+\frac{1}{2})\Delta)$, wherein n=0, 1, ... k, $\Delta$ is a relative flare intensity value, the flare intensity layers $F_i(n\Delta)$ contain flare intensity values between $(n-\frac{1}{2})\Delta$ and $(n+\frac{1}{2})\Delta$, the boundary flare intensity layers $F_j((n+\frac{1}{2})\Delta)$ contain flare intensity values between $(n+\frac{1}{2})\Delta-\sigma/2$ and $(n+\frac{1}{2})\Delta+\sigma/2$, and $\sigma$ is a predetermined flare tolerance value.

12. The non-transitory processor-readable medium recited in claim 11, wherein the generating flare difference layers comprises:

generating reference flare intensity layers $F_i^R(n\Delta)$ by replacing flare intensity values for other circuits in the array of identical circuits in $F_i(n\Delta)$ with corresponding flare intensity values for the reference circuit; and performing an operation of $F_i(n\Delta)$ XOR $F_i^R(n\Delta)$.

13. The non-transitory processor-readable medium recited in claim 11, wherein the generating tolerable flare difference layers comprises:

generating reference boundary flare intensity layers $F_j^R((n+\frac{1}{2})\Delta)$ by replacing flare intensity values for the array of identical circuits in $F_j((n+\frac{1}{2})\Delta)$ with corresponding flare intensity values for the reference circuit; and performing an operation of $F_j((n+\frac{1}{2})\Delta)$ AND $F_j^R((n+\frac{1}{2})\Delta)$.

14. The non-transitory processor-readable medium recited in claim 9, wherein the determining intolerable flare difference regions comprises:

generating a combined flare difference layer by combining the flare difference layers;

generating a combined tolerable flare difference layer by combining the tolerable flare difference layers; and removing regions defined by the combined tolerable flare difference layer from regions defined by the combined flare difference layer.

15. A system comprising one or more processors, the one or more processors programmed to perform a method of tolerable flare difference determination, the method comprising:

selecting a reference circuit in an array of identical circuits that are to be fabricated on a wafer;

determining, for the array of identical circuits, a first flare map that comprises flare intensity layers and a second flare map that comprises boundary flare intensity layers;

generating flare difference layers based on the first flare map and flare intensity information for the reference circuit;

generating tolerable flare difference layers based on the second flare map and boundary flare intensity information for the reference circuit;

determining intolerable flare difference regions based on the flare difference layers and the tolerable flare difference layers; and storing information of the intolerable flare difference regions in a tangible medium.

16. The system recited in claim 15, wherein the method further comprises performing a lithographic process on layout features for the intolerable flare difference regions and the reference circuit.

17. The system recited in claim 15, wherein the flare intensity layers are represented by $F_i(n\Delta)$ and the boundary flare intensity layers are represented by $F_j((n+\frac{1}{2})\Delta)$, wherein n=0, 1, ... k, $\Delta$ is a relative flare intensity value, the flare intensity layers $F_i(n\Delta)$ contain flare intensity values between $(n-\frac{1}{2})\Delta$ and $(n+\frac{1}{2})\Delta$, the boundary flare intensity layers $F_j((n+\frac{1}{2})\Delta)$ contain flare intensity values between $(n+\frac{1}{2})\Delta-\sigma/2$ and $(n+\frac{1}{2})\Delta+\sigma/2$, and $\sigma$ is a predetermined flare tolerance value.

18. The system recited in claim 17, wherein the generating flare difference layers comprises:

generating reference flare intensity layers $F_i^R(n\Delta)$ by replacing flare intensity values for other circuits in the array of identical circuits in $F_i(n\Delta)$ with corresponding flare intensity values for the reference circuit; and performing an operation of $F_i(n\Delta)$ XOR $F_i^R(n\Delta)$.

19. The system recited in claim 17, wherein the generating tolerable flare difference layers comprises:

generating reference boundary flare intensity layers $F_j^R((n+\frac{1}{2})\Delta)$ by replacing flare intensity values for the array of identical circuits in $F_j((n+\frac{1}{2})\Delta)$ with corresponding flare intensity values for the reference circuit; and performing an operation of $F_j((n+\frac{1}{2})\Delta)$ AND $F_j^R((n+\frac{1}{2})\Delta)$.

20. The system recited in claim 15, wherein the determining intolerable flare difference regions comprises:

generating a combined flare difference layer by combining the flare difference layers;

generating a combined tolerable flare difference layer by combining the tolerable flare difference layers; and removing regions defined by the combined tolerable flare difference layer from regions defined by the combined flare difference layer.

\* \* \* \* \*